United States Patent
Chakraborty et al.

(10) Patent No.: US 12,316,231 B2
(45) Date of Patent: May 27, 2025

(54) MONOLITHIC HALF-BRIDGE DIE

(71) Applicant: University of Maryland, College Park, College Park, MD (US)

(72) Inventors: Shiladri Chakraborty, Calcutta (IN); Yongwan Park, College Park, MD (US); Alireza Khaligh, Arlington, VA (US)

(73) Assignee: UNIVERSITY OF MARYLAND, COLLEGE PARK, College Park, MD (US)

(*) Notice: Subject to any disclaimer, the term of this patent is extended or adjusted under 35 U.S.C. 154(b) by 378 days.

(21) Appl. No.: 17/741,086

(22) Filed: May 10, 2022

(65) Prior Publication Data

US 2023/0369983 A1 Nov. 16, 2023

(51) Int. Cl.
*H02M 3/335* (2006.01)
*H02M 1/00* (2006.01)
*H02M 1/088* (2006.01)
*H02M 7/00* (2006.01)

(52) U.S. Cl.
CPC ..... *H02M 3/33571* (2021.05); *H02M 1/0058* (2021.05); *H02M 1/088* (2013.01); *H02M 7/003* (2013.01)

(58) Field of Classification Search
CPC .. H02M 1/088; H02M 3/33571; H02M 7/003; H01L 23/49503; H01L 22/00
See application file for complete search history.

(56) References Cited

U.S. PATENT DOCUMENTS

| | | | | |
|---|---|---|---|---|
| 9,640,471 | B2* | 5/2017 | Kinzer | H01L 24/06 |
| 9,818,686 | B2* | 11/2017 | Wu | H01L 24/32 |
| 10,833,596 | B1* | 11/2020 | Chen | H05K 7/20927 |
| 2012/0256193 | A1* | 10/2012 | Hebert | H01L 23/49575 |
| | | | | 257/532 |
| 2013/0256905 | A1* | 10/2013 | Cho | H01L 24/73 |
| | | | | 257/E23.174 |
| 2016/0308523 | A1* | 10/2016 | Otake | H01L 29/7805 |
| 2017/0033638 | A1* | 2/2017 | Lei | H02K 11/0094 |
| 2017/0229953 | A1* | 8/2017 | Otake | H01L 23/5386 |
| 2019/0237416 | A1* | 8/2019 | Gao | H01L 23/49827 |
| 2021/0013793 | A1* | 1/2021 | Xin | H01L 29/7428 |

OTHER PUBLICATIONS

Abou-Alfotouh et al., A 1-MHz Hard-Switched Silicon Carbide DC-DC Converter, IEEE Transactions on Power Electronics, 2006, 21(4):880-889.
Chen et al., A Review of SiC Power Module Packaging: Layout, Material System and Integration, CPSS Transactions on Power Electronics and Applications, 2017, 2(3):170-186.
(Continued)

*Primary Examiner* — Gary A Nash
(74) *Attorney, Agent, or Firm* — Quarles & Brady LLP

(57) ABSTRACT

Aspects of the disclosure relate to a half-bridge on a monolithic die. In one example, a half-bridge module includes a monolithic die, a high-side transistor integrated in the monolithic die, a low-side transistor integrated in the monolithic die, and a decoupling capacitor integrated in the monolithic die. The decoupling capacitor may be disposed between the high-side transistor and the low-side transistor. Other aspects, embodiments, and features are also claimed and described.

20 Claims, 8 Drawing Sheets

(56) References Cited

OTHER PUBLICATIONS

Diodes Incorporated, MOSFETs, Catalog, Jan. 2021, 36 pages.
EPC, EPC2152 80 V, 15 ePower(TM) Stage Preliminary Datasheet, Revision 2.0, Mar. 2021, 16 pages.
Furnival, Scalability of SiC Near Chip-Scale Packages for Electric Vehicle & Locomotive Traction, Feb. 24, 2020, https://eepower.com/technical articles/scalability-of-sic-near-chip-scale-packages-to-electric-vehicle-locomotive-traction/#, 6 pages.
Garrou, Wafer Level Chip Scale Packaging (WL-CSP): An Overview, IEEE Transactions on Advanced Packaging, 2000, 23(2):198-205.
Guacci et al., Analysis and Design of a 1200 V All-SiC Planar Interconnection Power Module for Next Generation More Electrical Aircraft Power Electronic Building Blocks, CPSS Transactions on Power Electronics and Applications, 2017, 2(4):320-330.
Hou et al., Review of Packaging Schemes for Power Module, IEEE Journal of Emerging and Selected Topics in Power Electronics, 2020, 8(1):223-238.
Jain et al., A 0.45-1 V Fully-Integrated Distributed Switched Capacitor DC-DC Converter with High Density MIM Capacitor in 22 nm Tri-Gate CMOS, IEEE Journal of Solid-State Circuits, 2014, 49(4):917-927.
Li et al., Understanding Switching Losses in SiC MOSFET: Toward Lossless Switching, In 2015 IEEE 3rd Workshop on Wide Bandgap Power Devices and Applications (WiPDA), pp. 257-262.
Moench et al., A 600V GaN-on-Si Power IC with Integrated Gate Driver, Freewheeling Diode, Temperature and Current Sensors and Auxiliary Devices, In CIPS 2020; 11th International Conference on Integrated Power Electronics Systems, pp. 1-6.
Zhang et al., Very High Frequency PWM Buck Converters Using Monolithic GaN Half-Bridge Power Stages with Integrated Gate Drivers, IEEE Transactions on Power Electronics, 2015, 31(11):7926-7942.

* cited by examiner

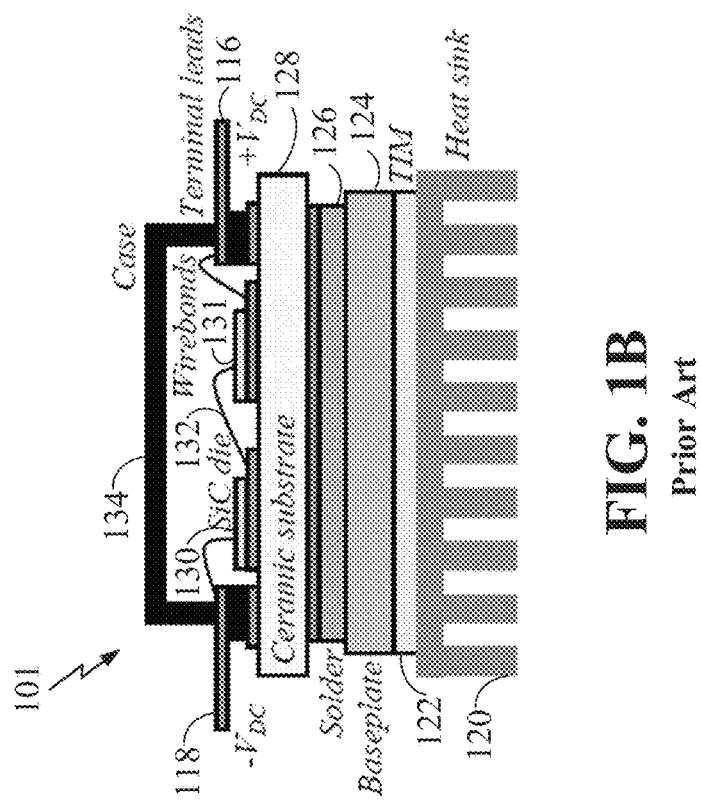
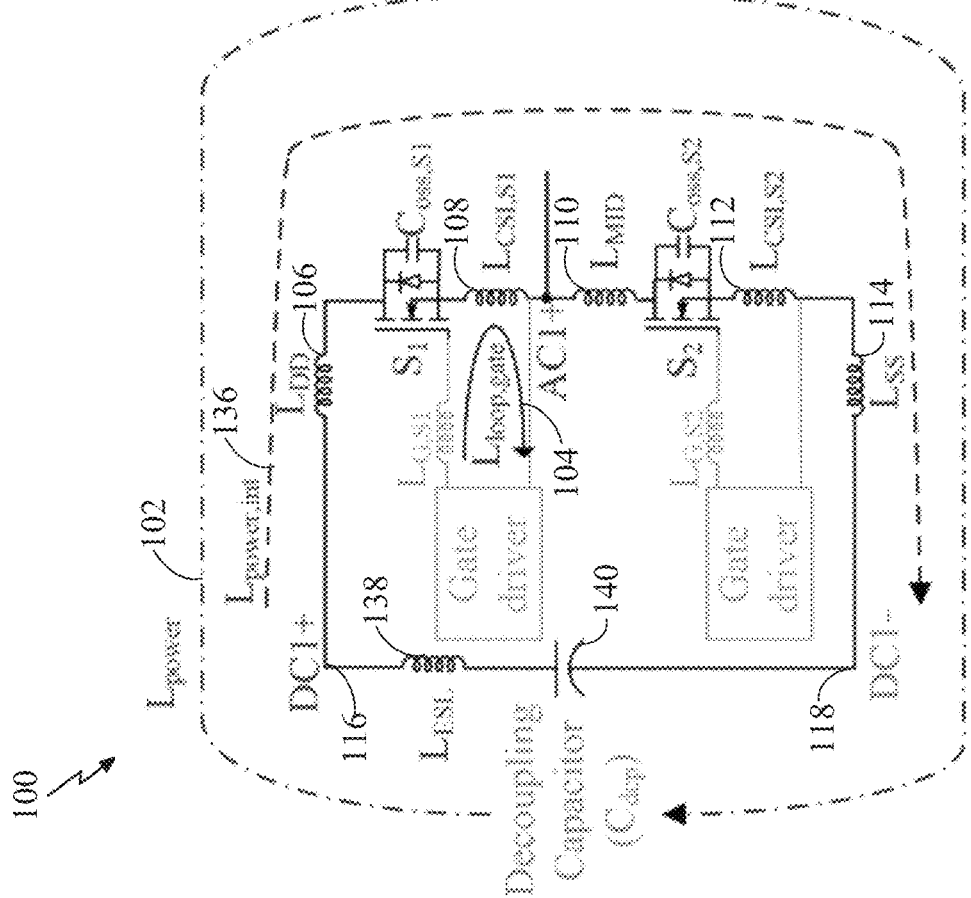
FIG. 1A
Prior Art
FIG. 1B
Prior Art

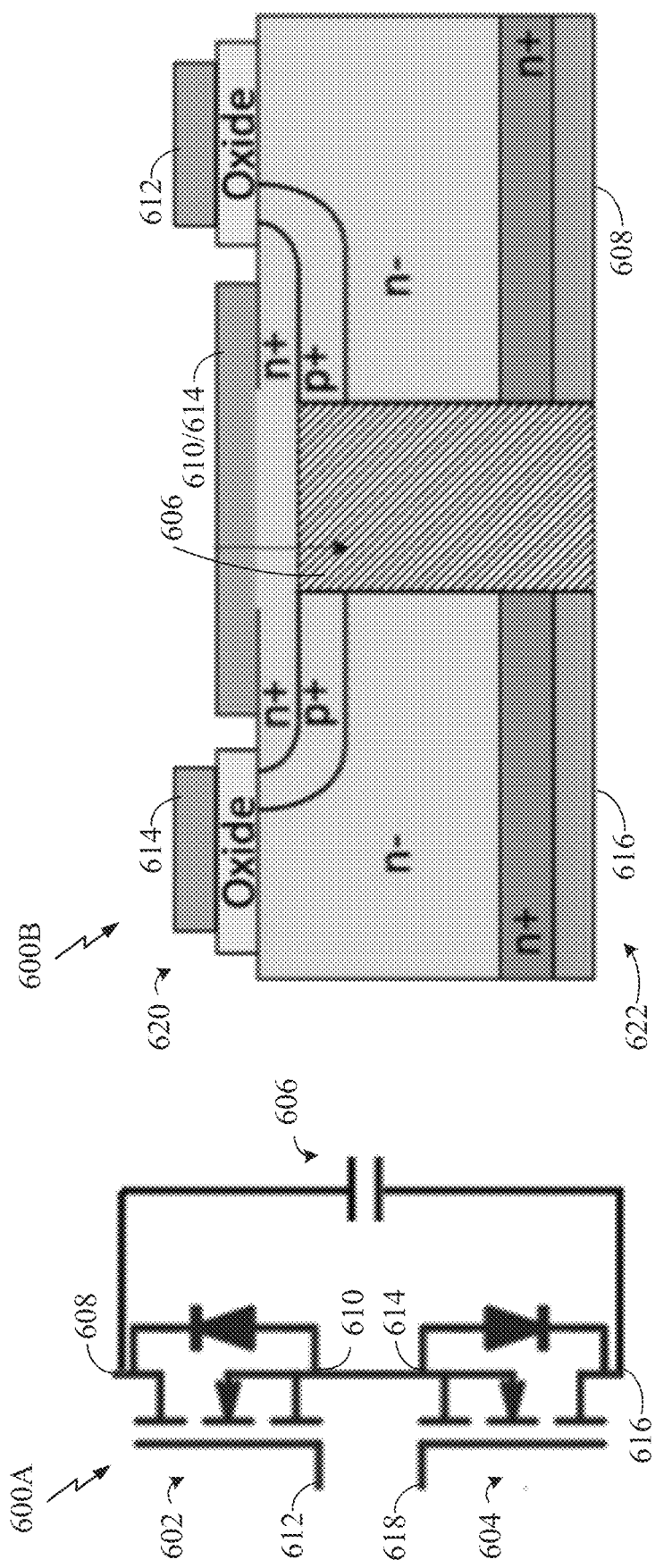

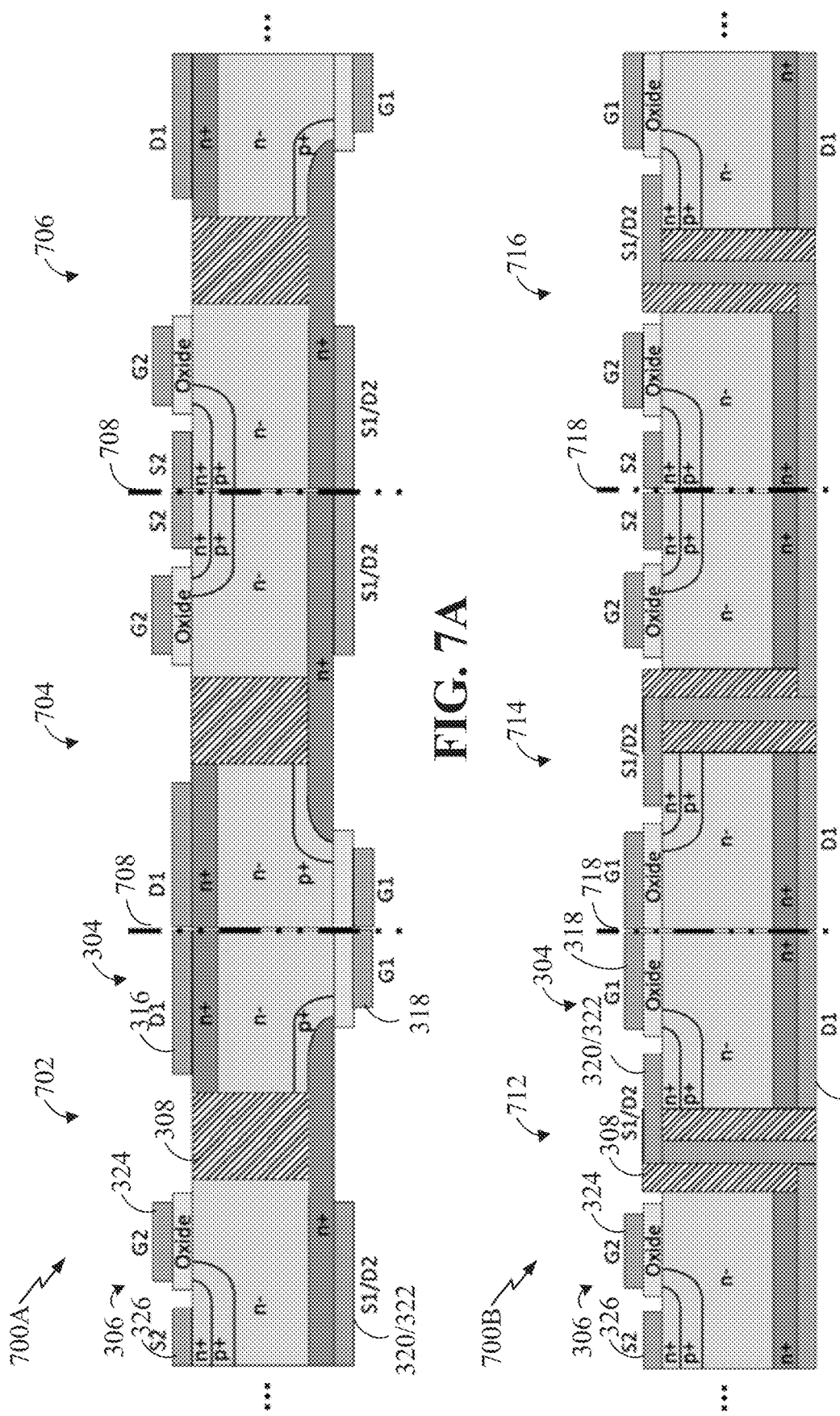

MONOLITHIC HALF-BRIDGE DIE

TECHNICAL FIELD

The disclosure discussed below generally relates to the field of half-bridge modules and fabrication methods of half-bridge modules.

INTRODUCTION

Electronic devices often employ high switching-frequency operations through power electronic converters based on half-bridge topologies. As the demand for half-bridges for high switching-frequency operations continues to increase, research and development must continue to advance and enhance high switching-frequency related technologies, to reduce stray inductance and any other electrical characteristics that reduce their effectiveness and/or require greater power to switch at higher frequencies.

BRIEF SUMMARY OF SOME EXAMPLES

The following presents a simplified summary of one or more aspects of the present disclosure, to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In various aspects, the disclosure generally relates to the field of power semiconductor half-bridges and fabrication methods of the same. As an example, a half-bridge module may include a monolithic die, a high-side transistor integrated in the monolithic die, a low-side transistor integrated in the monolithic die, and a decoupling capacitor integrated in the monolithic die, the decoupling capacitor disposed between the high-side transistor and the low-side transistor.

In other aspects, a half-bridge module may include a monolithic die, a first switch integrated in the monolithic die, a second switch integrated in the monolithic die, and a decoupling capacitor integrated in the monolithic die, the decoupling capacitor disposed between the first switch and the second switch.

These and other aspects of the technology discussed herein will become more fully understood upon a review of the detailed description, which follows. Other aspects, features, and embodiments will become apparent to those skilled in the art, upon reviewing the following description of specific, exemplary embodiments in conjunction with the accompanying figures. While the following description may discuss various advantages and features relative to certain embodiments and figures, all embodiments can include one or more of the advantageous features discussed herein. In other words, while this description may discuss one or more embodiments as having certain advantageous features, one or more of such features may also be used in accordance with the various embodiments discussed herein. Similarly, while this description may discuss exemplary embodiments as device, system, or method embodiments it should be understood that such exemplary embodiments can be implemented in various devices, systems, and methods.

BRIEF DESCRIPTION OF THE DRAWINGS

FIG. 1A is an existing schematic circuit diagram conceptually illustrating a half-bridge. FIG. 1B is an existing schematic diagram conceptually illustrating a silicon carbide (SiC) power module package.

FIG. 6A is an example schematic circuit diagram conceptually illustrating an example four-quadrant switch configuration according to some embodiments. FIG. 6B is an example side-view diagram conceptually illustrating the example four-quadrant switch configuration according to some embodiments.

FIG. 7A shows an example side view of an example wafer using mirrored unit cells of FIG. 4A before dicing the wafer into multiple dies according to some embodiments. FIG. 7B shows an example side view of an example wafer using mirrored unit cells of FIG. 5A before dicing the wafer into multiple dies according to some embodiments.

DETAILED DESCRIPTION

Figure 2A:
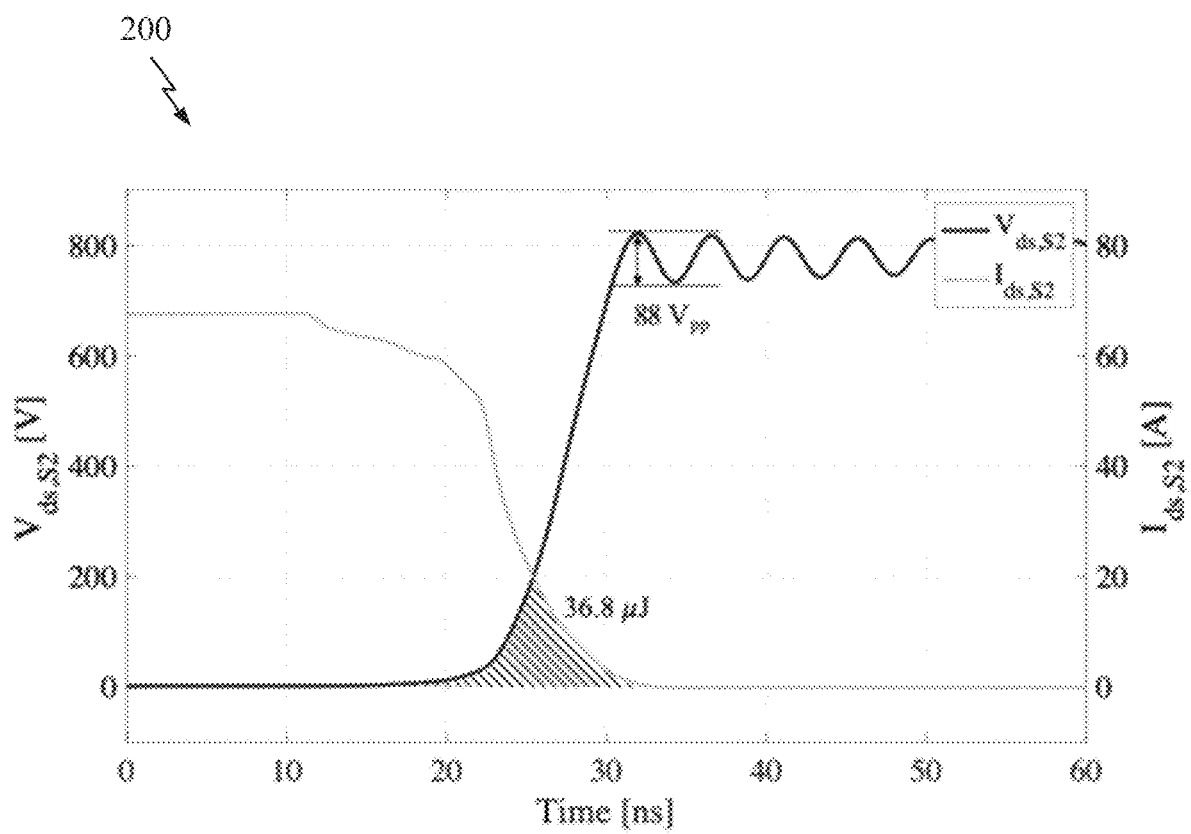
FIGS. 2A and 2B are example soft-switching timing voltage and current waveforms with a half-frequency half-bridge according to some embodiments.

The detailed description set forth below in connection with the appended drawings is intended as a description of various configurations and is not intended to represent the only configurations in which the subject matter described herein may be practiced. The detailed description includes specific details to provide a thorough understanding of various embodiments of the present disclosure. However, those skilled in the art will readily recognize that these embodiments may be practiced without these specific details. In some instances, this description provides well-known structures and components in block diagram form to avoid obscuring such concepts.

While this description describes aspects and embodiments by illustration to some examples, those skilled in the art will understand that additional implementations and use cases may come about in many different arrangements and scenarios. Embodiments described herein may be implemented across many differing platform types, devices, systems, shapes, sizes, packaging arrangements, etc. For example, embodiments and/or uses may come about via integrated chip embodiments and other non-module-component based devices (e.g., end-user devices, vehicles, communication devices, computing devices, industrial equipment, retail/purchasing devices, medical devices, AI-enabled devices, etc.). While some examples may or may not be specifically directed to use cases or applications, a wide assortment of applicability of described examples may occur. Implementations may range a spectrum from chip-level or modular components to non-modular, non-chip-level implementations and further to aggregate, distributed, or OEM devices or systems incorporating one or more aspects of the described examples. In some practical settings, devices incorporating described aspects and features may also necessarily include additional components and features for implementation and practice of claimed and described embodiments.

FIG. 1A is an existing schematic circuit diagram conceptually illustrating a high-frequency half-bridge formed using discrete components. High switching-frequency circuits such as the high-frequency half-bridge 100 can be configured to achieve some advantages like higher power-density (due to smaller size of capacitors and magnetics) and improved dynamic response. However, in some configurations, inductances in the power loop 102 and gate drive loops 104 may lead to high voltage and current oscillation issues. Configurations in which the various components are discrete/separate (e.g., in separate packages or otherwise separately manufactured then electrically connected) are especially susceptible to these issues. For example, half-bridge constructions in which the transistors 130, 131 and the decoupling capacitor 140 are separate packages and then are bonded/soldered with wires 132 together via a printed circuit board (PCB) are prone to stray inductance that negatively impacts performance due to an unintended inductance effect. These negative electrical effects become especially significant in the MHz switching range, since the stray inductances of the transistor package and PCB layout may become non-negligible.

FIG. 1B is a schematic, cross sectional diagram conceptually illustrating a silicon carbide (SiC) power module 101 using the high-frequency half-bridge architecture of FIG. 1A. In some examples, the SiC power module 101 may include a heat sink 120 for transferring the heat on the module to a fluid or other medium. The SiC power module 101 may also include a thermal interface material (TIM) 122 on the heat sink 120, a baseplate 124 on the TIM 122, a solder layer 126 on the baseplate, and a ceramic substrate 128 or PCB. The SiC power module 101 may further include two separate transistors 130, 131 connected with wires 132 on the ceramic substrate 128. The first transistor 130 is connected to a negative voltage terminal ($-V_{DC}$) 118 and the second transistor 131 with wires 132. Also, the second transistor 131 is connected to a positive voltage terminal ($+V_{DC}$) 116 and the first transistor 130 with wires 132. Thus, at least three wires are used to connect the transistors 130, 131 to the positive and negative voltage terminals 116, 118. A case 134 covers the two transistors 130, 131 and the wires 132 on the ceramic substrate 128 to protect the transistors 130, 131. The decoupling capacitor 140 (not shown in FIG. 1B) is external to the bridge or case 134 and is connected across the positive and negative voltage terminals 116, 118 via a wire. It should be appreciated that this is a mere example. Any other arrangements of layers and components can be included or replaced in the SiC power module 101. Including a decoupling capacitor 140 into a standard wire-bonded package 100, 101 shown in FIGS. 1A and 1B can improve its switching performance such that the capacitor can be placed much closer to the transistors 130, 131 or the dies, compared to the case when it is not co-packaged with the power module. However, even this approach generates unintended stray interconnection inductance and adds equivalent series inductance (ESL) of the capacitor to the loop inductance.

Figure 2B:
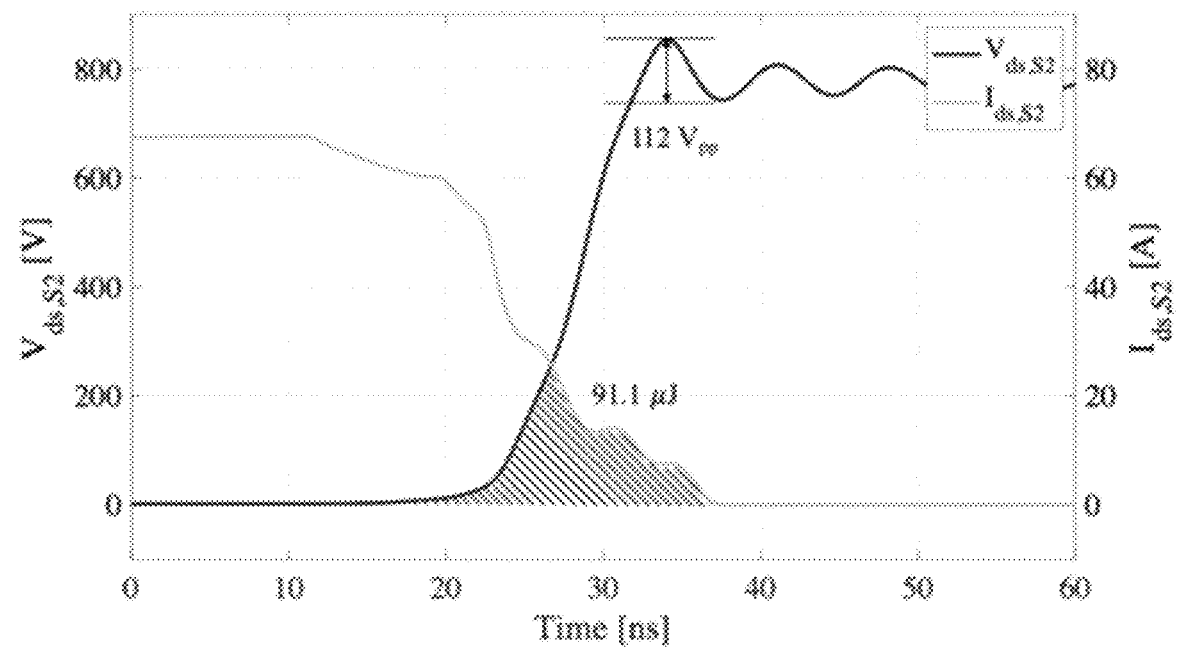

FIGS. 2A and 2B are soft-switching timing voltage and current waveforms for high-frequency half-bridge embodiments. FIG. 2A represents an example waveform for a half-bridge embodiment described in FIGS. 1A and 1B. FIG. 2A shows soft-switching timing voltage and current waveforms with 0.2 nH of inductance in each inductor of $L_{DD}$ 106, $L_{CSI,S2}$ 108, $L_{MID}$ 110, $L_{CSI,S2}$ 112, and $L_{SS}$ 114. In FIG. 2A, the realization of a half-bridge configuration by using discrete devices (two transistors and separate decoupling capacitors) inevitably entails high parasitic inductances, which are generally proportional to the physical length of connections. The high inductances (specifically $L_{DD}$ 106, $L_{MID}$ 110, $L_{SS}$ 114) result in larger oscillations and higher losses (specifically $L_{CSI,S1}$ 108 and $L_{CSI,S2}$ 112) at a switching event. Similarly, FIG. 2B shows soft-switching timing voltage and current waveforms for a half-bridge embodiment described in FIGS. 1A and 1B with different stray inductance values, having 1 nH of inductance in each inductor of $L_{DD}$ 106, $L_{CSI,S2}$ 108, $L_{MID}$ 110, $L_{CSI,S2}$ 112, and $L_{SS}$ 114. FIGS. 2A and 2B correspond to stray inductance values of 0.2 nH and 1 nH, respectively. Higher values of stray inductance results in greater ringing and larger switching loss (highlighted area under the curve corresponds to switching loss and is thus larger for FIG. 2B). In some examples, FIGS. 2A and 2B qualitatively show the impact of different inductances on switching losses and ringing, which can be used to emphasize the necessity of reduced inductances.

In some examples, low-inductance packaging approaches may exploit the advantages of high switching frequency operations while mitigating some of the challenges of architectures based on multiple discrete components. Thus, packaging the half-bridge components more tightly with related components like the decoupling capacitor can offer some advantages. These embodiments make take several forms: in one such embodiment, the decoupling capacitor may be disposed within the same IC package (i.e., within the same physical case) as the half-bridge transistors; in other embodiments, the decoupling capacitor may be directly bonded to the IC package of the half-bridge (rather than, e.g., distanced on a common side of a PCB). For SiC-based, half-bridge modules, these approaches may be accomplished by integrating dc-link capacitors, gate-driver ICs, and/or resistors close to the bare-die transistors. Further, the integration may further utilize planar bonding, flip-chip wire-bondless bonding, and/or electro-thermally multi-functional components. Such integration approaches lead to lower values of power loop inductance (compared to, e.g., power loop inductance 102 ($L_{power}$) FIG. 1A) and thereby improve switching performance by reducing voltage spikes across switches, switching losses, and electromagnetic interference (EMI).

Similarly, close integration of the gate drive resistors and/or gate driver ICs reduces the gate drive loop area, resulting in a smaller value of gate loop inductance. This in turn lowers the minimum required gate resistance to have a critically-damped gate loop operation and thus improves switching performance by speeding up switching transitions and thereby reducing switching losses. The lowest value of layout-related power loop inductance 136 ($L_{power,int}$) of a high-frequency half-bridge switch configuration resulting from packaging-based integration approaches is 1-2 nH. However, the existence of the equivalent-series-inductance 138 ($L_{ESL}$) of the decoupling capacitors 140 of the half-bridge leg, which can be higher than 1 nH, imposes limitations on the overall power-loop inductance ($L_{power,int}$ 136+ $L_{ESL}$ 138) of the half-bridge 100.

While the aforementioned approaches represent package-level solutions for half-bridge modules, die-level integrated solutions can be utilized with even greater improvement in performance. However, existing die-level solutions are realized on lateral semiconductor devices such as silicon (Si)-based back-to-back switches and Gallium-Nitride-based half-bridge switches. All existing half-bridge chips consist of lateral dies. Furthermore, although several lateral die-based half-bridge chips may integrate gate-driver circuitry, decoupling capacitors were not integrated with any of them. However, in an example half-bridge, the gate-drive circuitry and the high-side and low-side devices of the example half-bridge may be realized on a single monolithic GaN die, which may lower parasitic inductances and enables operation at tens of MHz (at relatively low power). It is less complicated and challenging to achieve such integration when the devices are lateral devices, in which the gate, source, and drain of the devices are on the same side of the die. However, vertical power metal-oxide semiconductor field-effect transistors (MOSFETs) have the drain pad on the other side of the gate and source, so it is more challenging to integrate several MOSFETs into a single die in a series fashion. Nonetheless, recent technological advancements in the field of 3D integrated circuits (ICs), which mainly have been used for low-power, micro- and nano-scale, and/or monolithic processor ICs, can be considered to realize the integration in high power devices.

Other examples may closely integrate two separate SiC MOSFET dies into a small package (e.g., Near-CSP). However, DC-link decoupling capacitors may be still present outside the half-bridge switch module and connected to it using PCB traces, which ultimately limits the switching performance of the half-bridge module of power converters. Besides, the technology still uses post-process such as aligning, thinning and bonding, which adds to the manufacturing cost and complexity.

In some examples, a vertical SiC-based, high-performance switching half-bridge may be integrated in the same SiC die. Since the high-side and low-side transistors may be on the same die, any additional inductance due to external connection between the source terminal of the high-side transistor and the drain terminal of the low-side transistor may be eliminated. To further reduce loop inductance, the DC bus decoupling capacitor ($C_{dcp}$) from the drain terminal of the high-side transistor to the source terminal of the low-side transistor may also be implemented on the same die. This may not only reduce $L_{power}$ 102 by reducing the power loop area but also eliminate the $L_{ESL}$ 138 invariably present in all discrete capacitors. In some embodiments, the value of this decoupling capacitance 140 may be desired to be at least one order of magnitude higher than the inherent $C_{oss}$ 142, 144 of the SiC MOSFETs to achieve satisfactory decoupling action, though other thresholds may be applicable depending on the circuit design. Thus, if the $C_{oss}$ 142, 144 of each designed transistor is 200 pF, the target value of $C_{dcp}$ 140 may be around 2 nF. Finally, to complete the integration, the gate resistance of each of the high-side and low-side transistors can also be integrated in the same die. To achieve sufficiently fast switching commutation, a target value of 1Ω may be used in some embodiments for these intrinsic gate resistances.

Additionally, any other suitable techniques may also be employed in single-die embodiments, to further increase the value of $C_{dcp}$ 140, including intentionally high parasitic capacitance between two target nodes. For example, deep trench, gate oxide, metal finger, gate oxide silicon-on-insulator (SOI) and/or metal-insulator-metal (MIM) technologies may be used for the capacitance 140. For this capacitance 140, an additional space on the die for the capacitance may be exploited. Depending on the selected technology, the extension can be acquired via either the doping level or the metallization level. The high dielectric strength of SiC substrate (typically more than six times higher than that of Si) may help achieve relatively high capacitance. Fundamentally, the capacitance 140 between two potential nodes is determined by the overlapping area and the distance between the two, respectively, proportional and inversely proportional to the capacitance 140. The high dielectric strength of SiC material may allow close placement of the two nodes without causing dielectric breakdown. Therefore, smaller areas may be used to achieve a desired value of $C_{dcp}$ 140, compared with Si die. It should be appreciated that the examples described above are applicable to any type of vertical and lateral power MOSFETs, regardless of the structure.

Figure 3:
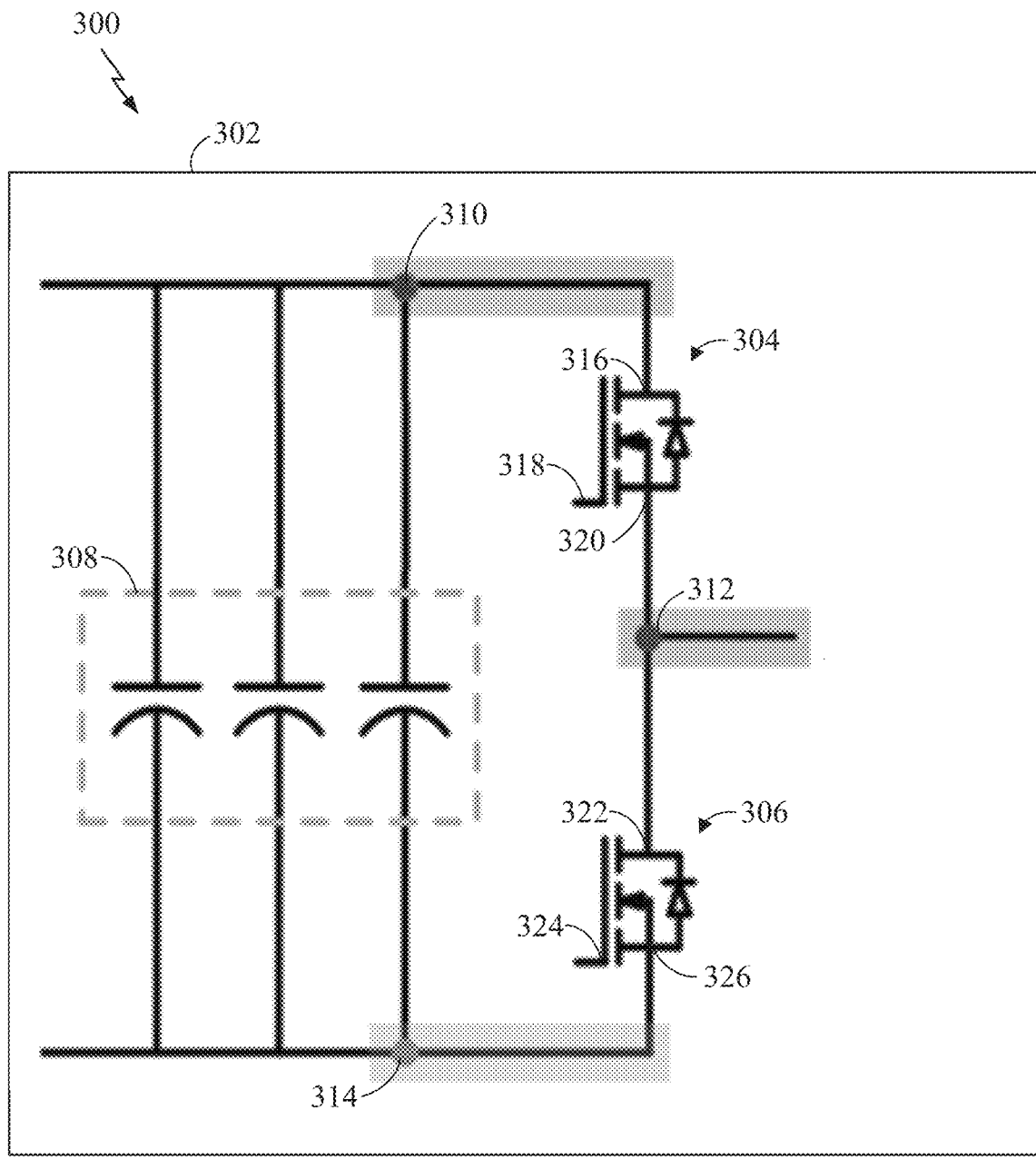
FIG. 3 is an example schematic circuit diagram conceptually illustrating an example half-bridge according to some embodiments.

FIG. 3 is an example conceptual circuit diagram illustrating an example half-bridge architecture according to certain embodiments offering reduced stray inductance. For example, an example half-bridge module 300 may be formed from a single monolithic die 302, on which a high-side transistor 304, a low-side transistor 306, and/or a decoupling capacitor 308 are formed. A monolithic die 302 may be a unit or small block of semiconducting material on which a given functional circuit is fabricated. In some instances, integrated circuits in corresponding dies may be produced on a single wafer of electronic-grade silicon or other semiconductor material through various processes (e.g., photolithography). Then, the wafer may be sliced to separate individual dies.

In some aspects of the disclosure, the high-side transistor 304 is integrated in the monolithic die 302. In some examples, the high-side transistor 304 may include a Metal Oxide Semiconductor Field-Effect Transistor (MOSFET), though other types of transistors may likewise be used. The high-side transistor 304 may be a switch connected between a positive voltage terminal (V+) 310 and a terminal 312 to a load. For example, a drain terminal 316 of the high-side transistor 304 may be connected to the positive voltage terminal 310 and a source terminal 320 of the high-side transistor 304 may be connected to a terminal 312 of a load. In some examples, the high-side transistor 304 may be a vertical power device such that a direction of main current of the high-side transistor is perpendicular to a top surface of the monolithic die 302 as shown in FIGS. 4B and 5B. In some examples, the top surface of the monolithic die 302 may be a surface on which the photolithographic and chemical processing are performed. In other examples, the high-side transistor 304 may be a lateral power device such that the direction of main current of the high-side transistor 304 is in parallel to the top surface of the monolithic die 302. In further examples, a gate terminal 318 of the high-side transistor 304 may be connected to a gate-driver, which is on the same monolithic die 302. In even further examples, the gate terminal 318 of the high-side transistor 304 may be connected to a gate-resistor, which is on the same monolithic die 302.

In further aspects of the disclosure, the low-side transistor 306 is integrated in the monolithic die 302. In some examples, the low-side transistor 306 may include a Metal Oxide Semiconductor Field-Effect Transistor (MOSFET). The low-side transistor 306 may be a switch connected between a terminal 312 to a load and a negative voltage terminal (V−) 314 or a ground terminal. For example, a drain terminal 322 of the low-side transistor 306 may be connected to a terminal 312 of a load, and a source terminal 326 of the low-side transistor 306 may be connected to a negative voltage terminal 314 or a ground terminal. In some examples, the low-side transistor 306 may be a vertical power device such that a direction of main current of the high-side transistor is perpendicular to the top surface of the monolithic die 302 as shown in FIGS. 4B and 5B. In other examples, the low-side transistor 306 may be a lateral power device such that the direction of main current of the low-side transistor 306 is in parallel to the top surface of the monolithic die 302. In further examples, a gate terminal 324 of the low-side transistor 306 may be connected to a gate-driver, which is on the same monolithic die 302. In even further examples, the gate terminal 324 of the low-side transistor 306 may be connected to a gate-resistor (not shown in FIG. 3), which is on the same monolithic die 302. In some scenarios, the source terminal 320 of the high-side transistor 304 may be directly connected to the drain terminal 322 of the low-side transistor 306 without an inductor. Thus, any additional inductance due to external connection between the source terminal 320 of the high-side transistor 304 and the drain terminal 322 of the low-side transistor 306 can be eliminated.

In even further aspects of the disclosure, the decoupling capacitor(s) 308 may be integrated in the monolithic die 302. Here, the decoupling capacitor 308 may contribute to ringing mitigation by reducing power commutation loop inductance on account of i) its low equivalent series inductance (ESL), ii) small physical size enabling close proximity to the power semiconductor half-bridge. Integrating this capacitor 308 monolithically into the die (as shown in FIG. 3) may further improve the performance significantly due to elimination of interconnection inductances and ESL caused by wires. In some examples, the decoupling capacitor 308 may be more than one DC bus decoupling capacitor. In further examples, the decoupling capacitor 308 may be disposed between the high-side transistor 304 and the low-side transistor 306. In even further examples, the half-bridge module 300 may further include a silicon carbide (SiC) substrate on the monolithic die. Thus, the high dielectric strength of the SiC substrate may lead to relatively high capacitance.

In some instances, the capacitance value of the decoupling capacitor 308 may be determined based on an overlapping area of the drain terminal 316 of the high-side transistor 304 and the source terminal 326 of the low-side transistor 306 on the top surface of the monolithic die 302 (e.g., a distance between the drain terminal 316 of the high-side transistor 304 and the source terminal 326 of the low-side transistor 306). Thus, the high dielectric strength of the SIC substrate may allow close placement of the two nodes (e.g., the drain terminal 316 of the high-side transistor 304 and the source terminal 326 of the low-side transistor 306) and reduce the area between the high-side transistor 304 and the low-side transistor 306. A first terminal (i.e., positive voltage terminal 310) of the decoupling capacitor 308 may be connected to a drain terminal 316 of the high-side transistor 304 while a second terminal (i.e., negative voltage terminal 314) of the decoupling capacitor 308 may be connected to the source terminal 326 of the low-side transistor 306. In further examples, the decoupling capacitor 308 may be more than one DC bus decoupling capacitor. The multiple decoupling capacitors 308 may be connected in parallel to the drain terminal 316 of the high-side transistor 304 and the source terminal 326 of the low-side transistor 306. In further examples, the capacitance value of the decoupling capacitor 308 may be at least one order of magnitude higher than the capacitance value of the high-side transistor 304 or the low-side transistor 306. For example, when the capacitance value of the high-side transistor 304 or the low-side transistor 306 is 200 pF, the target value of the decoupling capacitor is around 2 nF.

Figure 4A:
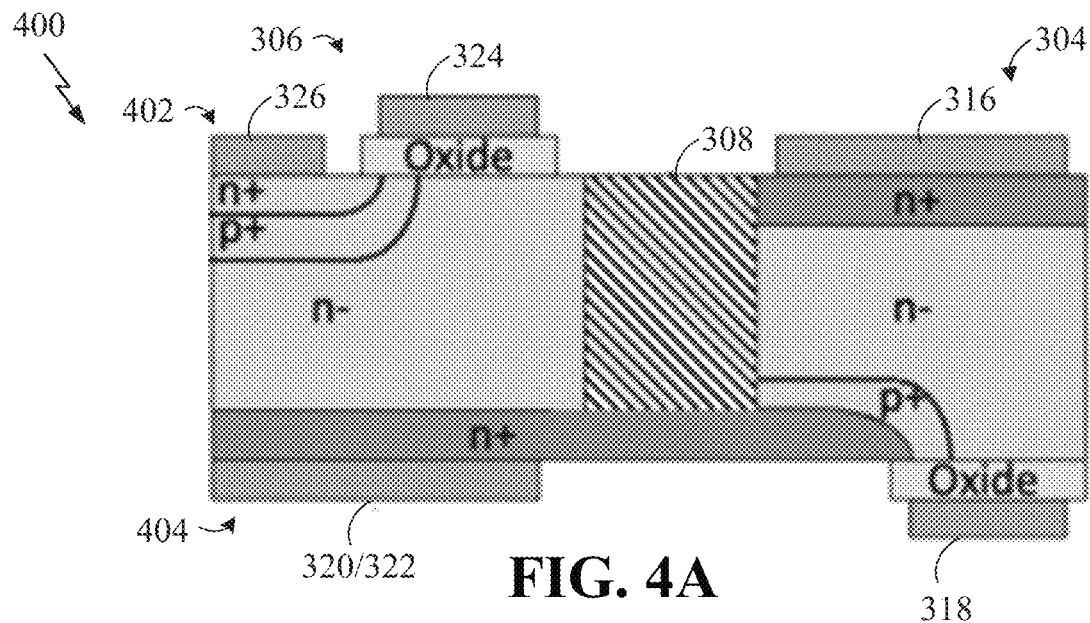
FIGS. 4A and 4B are example side-view and top-view diagrams, respectively, conceptually illustrating an example U-shaped half-bridge die according to some embodiments.
Figure 4B:
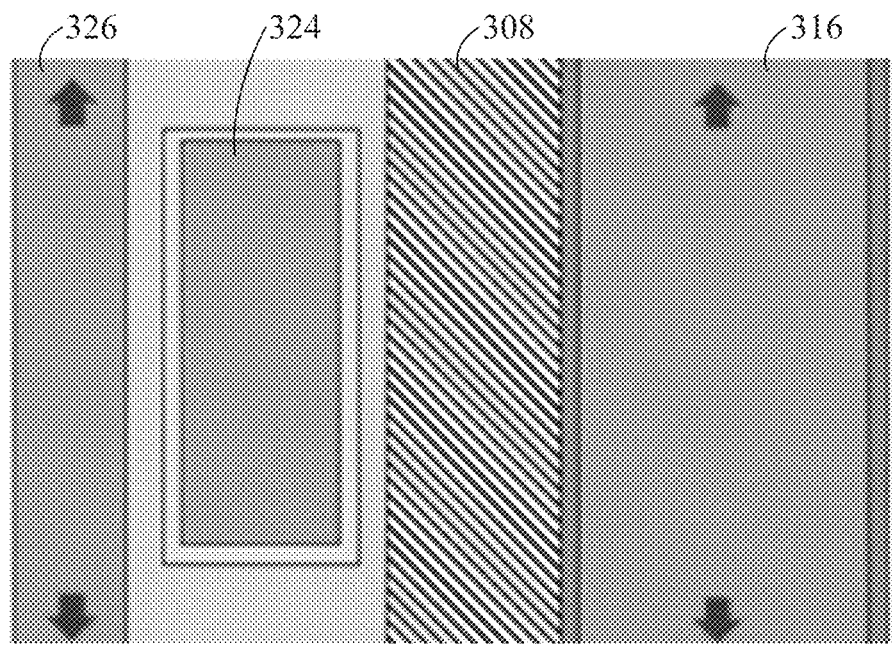

FIGS. 4A and 4B are example side-view and top-view diagrams, respectively, conceptually illustrating an example U-shaped half-bridge die according to some embodiments. Each node in FIGS. 4A and 4B may correspond to the respective node denoted in FIG. 3. FIGS. 4A and 4B illustrate a half-bridge die implemented through asymmetric doping. For example, one of the two switches or transistors 304, 306 is upside down; therefore, the direction of the main current through the half-bridge can be depicted as a U-shape. In some examples, the high-side transistor 304 may be disposed in an opposite side to the low-side transistor 306 such that the main current flows in a U-shape. The drain terminal 316 of the high-side transistor 304 and the source terminal 326 of the low-side transistor 306 may be expanded to one side or both sides to implement the desired value of the decoupling capacitor 308 ($C_{dcp}$). For example, the source terminal 326 of the low-side transistor 306 may be on the top surface 402 of the monolithic die 400. The drain terminal 322 of the low-side transistor 306 may be on the bottom surface 404 of the monolithic die 400. The source terminal 320 of the high-side transistor 304 may be on the bottom surface 404 of the monolithic die 400. The drain terminal 316 of the high-side transistor 304 may be on the top surface 402 of the monolithic die 400. This composition is advantageous in terms of the maximum current due to its minimum distance for the current flow. However, the asymmetric structure might use additional post-process on the bottom side including implementation of the gate-oxide layer.

Figure 5A:
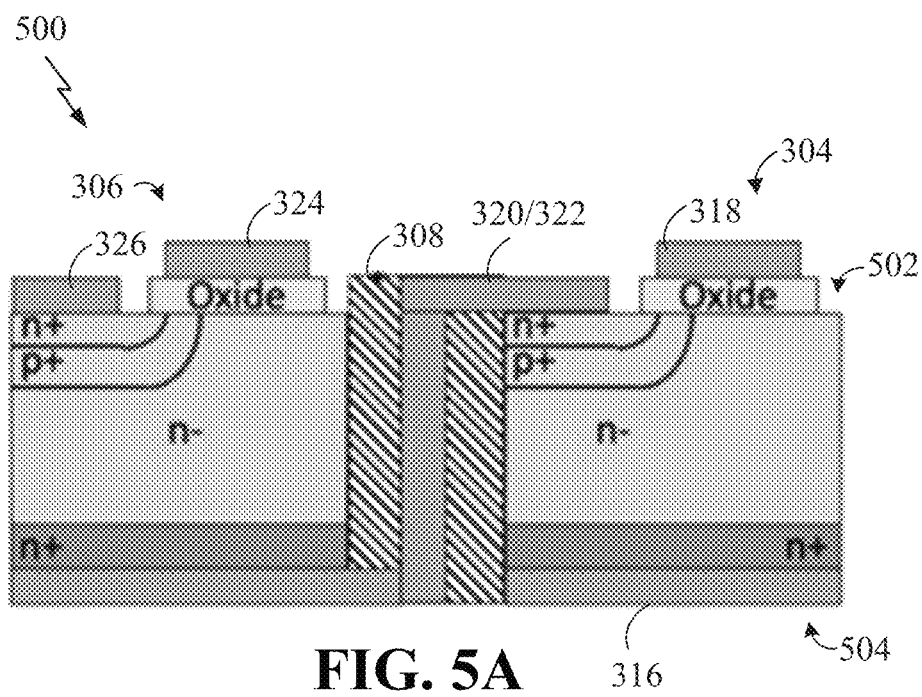
FIGS. 5A, 5B, and 5C are example side-view, top-view, and bottom-view diagrams, respectively, conceptually illustrating an example N-shaped half-bridge die according to some embodiments.
Figure 5B:
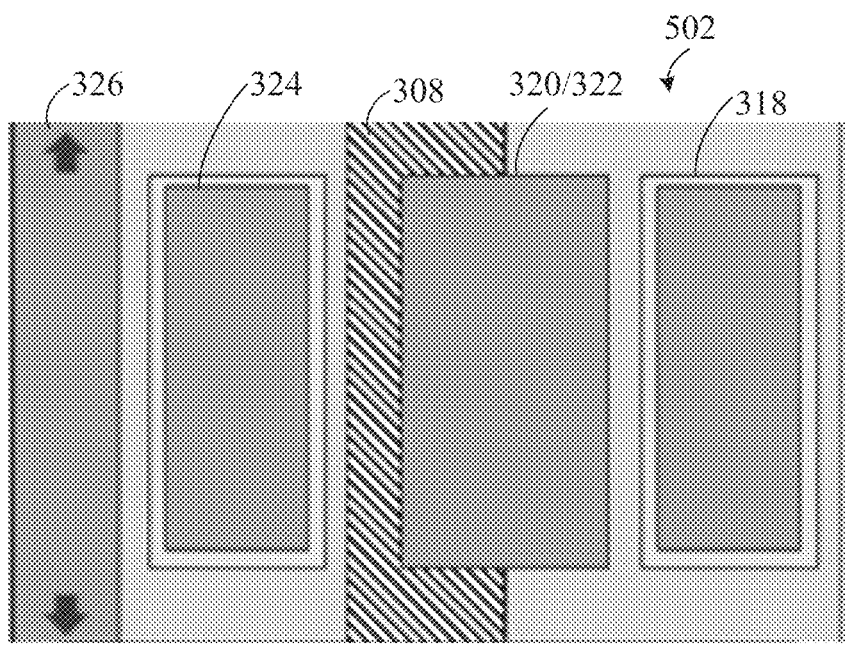
Figure 5C:
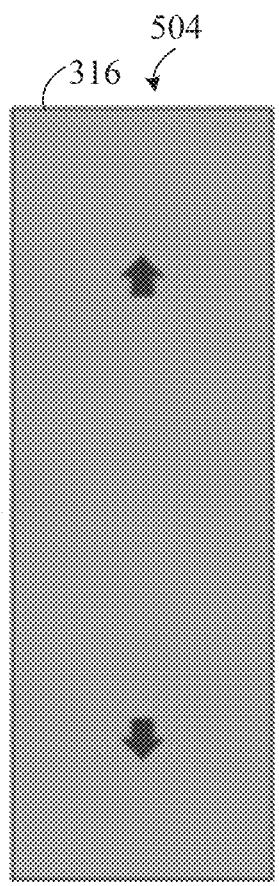

FIGS. 5A, 5B, and 5C are example side-view, top-view, and bottom-view diagrams, respectively, conceptually illustrating an example N-shaped half-bridge die according to some embodiments. Each node in FIGS. 5A, 5B, and 5C may correspond to the respective node denoted in FIG. 3. The monolithic die 500 (e.g., (e.g., half-bridge die) in FIGS. 5A, 5B, and 5C shows N-shaped current flow through a symmetric structure. For example, the high-side transistor 304 and the low-side transistor 306 may be symmetrically disposed in the monolithic die 500 such that main current flows in an N-shape. In some examples, the source terminal 326 of the low-side transistor 306 is on the top surface 502 of the monolithic die 500. In further examples, the drain terminal 322 of the low-side transistor 306 may be connected from a bottom surface 504 of the monolithic die 500 to the top surface 502 of the monolithic die 500. In even further examples, the source terminal 320 of the high-side transistor 304 may be connected from the top surface 502 of the monolithic die 500 to the bottom surface 504 of the monolithic die 500, and the drain terminal 316 of the high-side transistor 304 may be on the bottom surface 504 of the monolithic die 500. The source terminal 320 of the high-side transistor 304 may share the same node as the drain terminal 322 of the low-side transistor 306. The same structure for each switch can be repeated, and the connection between the two switches can be made through deep etching techniques such as Bosch etching and deep-trench etching. In some examples, this structure may be applicable to fan-out die fabrication technique as the bottom side of the die does not house any other layer except for metal pads, which can significantly benefit the cost and manufacturing aspects.

In some scenarios, a through-chip connection could limit the maximum current specification (which is to form the "source terminal 320 of the high-side transistor 304/the drain terminal 322 of the low-side transistor 306" node). The structure may be directly applied to a four-quadrant switch configuration for cycloconverters, of which the two switches share a common source. A possible realized example is illustrated in FIGS. 6A and 6B. FIG. 6A is an example schematic circuit diagram conceptually illustrating an example four-quadrant switch configuration. FIG. 6B is an example side-view diagram conceptually illustrating the example four-quadrant switch configuration. The snubber capacitor 606 across the switch configuration can be implemented at a die-fabrication level through the same manner above. In some examples, the source terminal 610 of the low-side transistor 604 and the source terminal 612 of the high-side transistor 602 may be on the top surface 620 of the monolithic die 600B. In further examples, the drain terminal 616 of the low-side transistor 604 and the drain terminal 608 of the high-side transistor 602 may be on the bottom surface 622 of the monolithic die 600B. In even further examples, the source terminal 614 of the low-side transistor 604 and the source terminal 610 of the high-side transistor 602 share a common source terminal on a top surface 620 of the monolithic die 600B.

In some examples, the overall fabrication process of the embodiments of FIG. 4A and FIG. 5A may use a vertical double-diffused metal oxide semiconductor (VDMOS) fabrication method. In addition, both structures shown in FIGS. 4A and 5A may use an additional process of deep-etching, which can be done through deep-trench etching or Bosch etching technologies, and passivation layers (e.g., through a protection film deposition technique like C4F8 plasma deposition) may be implemented onto the groove to provide insulation between different potential nodes (e.g., two transistors 306, capacitors 308, etc.). In addition, the embodiment in FIG. 4A may use additional steps involving another gate oxide layer after flipping the wafer as the gate of the high-side switch is located on the opposite side. Lastly, the drain terminal 316 of the high-side switch 304 and the source terminal 326 of the low-side switch 306 should be extended to the space beside to secure enough capacitance so that the decoupling capacitor can be realized.

To further improve the productivity and thereby the technology's yield ratio, the example structures in FIG. 4A and FIG. 5A can be implemented in a mirrored fashion before dicing the dies from a wafer, as shown in FIGS. 7A and 7B. FIG. 7A shows an example side view of a wafer using mirrored unit cells of FIG. 4A before dicing the wafer 700A into multiple dies. For example, each die 702, 704, 706 may have a first end and second end in a side view. The first end of a first die 702 may be connected to the first end of a second die 704, and the second end of the second die 704 may be connected to the second end of a third die 706. Thus, the drain terminal 316 of the high-side switch 304 in the first die 702 and the drain terminal 316 of the high-side switch 304 in the second die 704 abut or adjoin each other. Also, the gate terminal 318 of the high-side switch 304 in the first die 702 is connected to the gate terminal 318 of the high-side switch 304 in the second die 704. Similarly, the source terminal 326 of the low-side switch 306 in the second die 704 and the source/drain terminal 320/322 of the low-side switch 306 in the second die 704 are connected to the source terminal 326 of the low-side switch 306 in the third die 706 and the source/drain terminal 320/322 of the low-side switch 306 in the third die 706, respectively. In a fabrication process, each die is cut along the cut (dicing) plane line 708, FIG. 7B shows an example side view of an example wafer using mirrored unit cells of FIG. 5A before dicing the wafer 700B into multiple dies. For example, each die 712, 714, 716 may have a first end and second end in a side view. The first end of a fourth die 712 may be connected to the first end of a fifth die 714, and the second end of the fifth die 714 may be connected to the second end of a sixth die 716. Thus, the gate terminal 318 of the high-side switch 304 in the fourth die 712 and the drain terminal 316 of the high-side switch 304 in the fourth die 712 are connected to the gate terminal 318 of the high-side switch 304 in the fifth die 714 and the drain terminal 316 of the high-side switch 304 in the fifth die 714, respectively. Similarly, the source terminal 326 of the low-side switch 306 in the fifth die 714 and the drain terminal 316 of the high-side switch 304 in the fifth die 714 are connected to the source terminal 326 of the low-side switch 306 in the sixth die 716 and the drain terminal 316 of the high-side switch 304 in the sixth die 716, respectively. In a fabrication process, each die is cut along the cut (dicing) plane line 718.

In some examples, a new paradigm for an integrated high-frequency switching half-bridge leg is implemented, with all of the high-side transistor, low-side transistor, DC bus decoupling capacitor and gate resistors to be realized on the same monolithic die. The resulting monolithic die will be a seven-terminal entity having three power terminals/pads: the DC+ terminal, the DC− terminal, the switch-node terminal and four control terminals/pads, gate and source terminals of the high-side and low-side transistors. The example embodiments can lead to ultra-low power loop inductances in the order of a few 100 pH from a single switching half-bridge. Furthermore, the cost and manufacturing complexity can be significantly reduced attributed to mature chip-fabrication technologies.

The disclosed half-bridge embodiments, including those implemented via monolithic die architectures, provide numerous advantages as explicitly or implicitly disclosed above. For example, the disclosed half-bridge monolithic die can be implemented by using vertical power devices such as SiC power MOSFETs, which can be applied to converters with high frequencies (>1 MHz). Decoupling capacitance can be implemented in the same die with the switches. The high dielectric strength of SiC material helps reduce the area used for implementing the decoupling capacitance. All existing methods for implementing silicon-based capacitors, e.g., deep trench, gate oxide, metal finger, gate oxide silicon-on-insulator (SOI) and metal-insulator-metal (MIM), can be applied. The decoupling capacitor-integration can be applied to lateral semiconductor-based power switches. Gate-driver components, e.g., gate-driver and gate-resistor, can be further integrated into the monolithic power die. The asymmetrically-doped U-shaped structure can cover high currents. The symmetrically-doped N-shaped structure is applicable to conventional semiconductor chip-fabrication technologies. The symmetrically-doped N-shaped structure is applicable to fan-out chip-fabrication technologies as the same unit switch structure is repeated. A four-quadrant switch configuration can be implemented by using the same embodiments in connection with FIGS. 4A-4B and 5A-5C. A snubber capacitor can be integrated into the four-quadrant switch die through the same manner with the decoupling capacitors for half-bridge configuration. Gate-driver components can be integrated into the four-quadrant switch die through the same way with the half-bridge die. The monolithic die-integration can enhance the electrical performance by eliminating every layout- and package-related parasitic inductance. The monolithic die-integration can reduce the cost and manufacturing complexity as it can minimize post-processing steps for fabrication. The monolithic die-integration can reduce footprint areas. However, it should be appreciated that the embodiments and benefits of the half-bridge module are not limited to the list disclosed above. The example half-bridge modules on a monolithic die are applicable to any type of vertical and lateral power MOSFETs, regardless of the structure.

Figure 8:
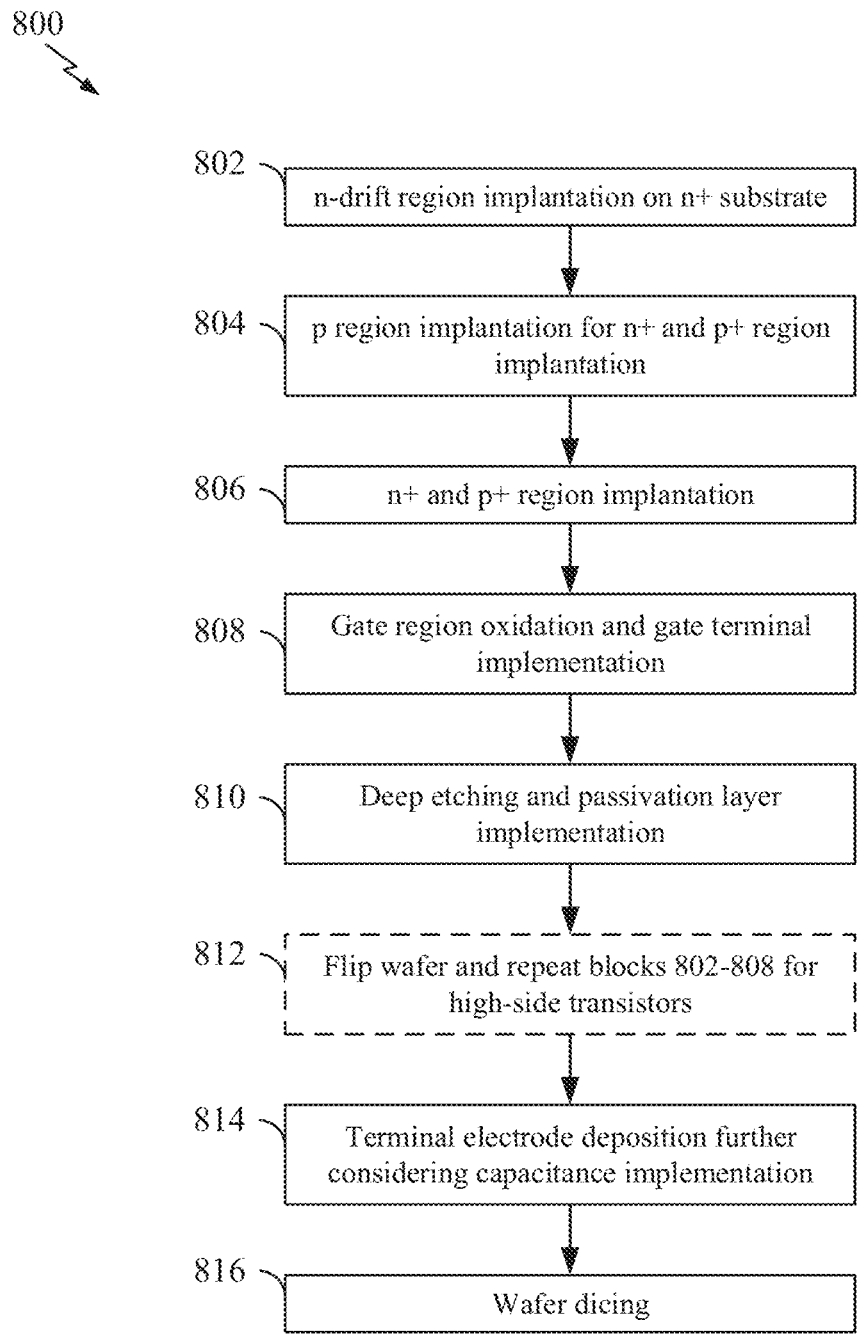
FIG. 8 is a flow diagram illustrating an exemplary fabrication process according to some embodiments.

FIG. 8 is a flow diagram illustrating an exemplary fabrication process of the example half-bridge modules according to some embodiments. As described below, a particular implementation may omit some or all illustrated features to implement all embodiments. In some examples, any suitable system, apparatus, or means for carrying out the operations or features for wafer or die fabrication described below may perform the process 800. In some examples, the process 800 is for fabricating multiple dies in a wafer shown in FIGS. 4-7.

In step 802, a system may perform n-drift region implantation on n+ substrate. In step 804, the system may perform p region implantation for n+ and p+ region implantation. In step 806, the system may perform n+ and p+ region implantation. In step 808, the system may perform gate region oxidation and gate terminal implementation. In some examples, the system may use VDMOS fabrication techniques in steps 802, 804, 806, and/or 808.

In step 810, the system may perform deep etching and passivation layer implementation. The system may flip wafer and repeat processes in steps 802, 804, 806, and 808 for high-side transistors. The process in step 812 is an optional process and may be exploited for wafer fabrication (e.g., of FIG. 4A). In step 814, the system may perform terminal electrode deposition further considering capacitance implementation. In step 816, the system may dice the wafer into multiple dies. In some examples, the process in steps 810, 812, 814, and/or 816 may use an additional process of deep-etching (e.g., for both structures shown in FIGS. 4A and 5A), which can be done through deep-trench etching or Bosch etching technologies, and passivation layers may be implemented onto the groove to provide insulation between different potential nodes. In addition, the example embodiment in FIG. 4A may use additional steps involving another gate oxide layer after flipping the wafer as the gate of the high-side switch is located on the opposite side. Lastly, the drain terminal of the high-side switch and the source terminal of the low-side switch should be extended to the space beside to secure enough capacitance so that the decoupling capacitor can be realized.

Other examples and uses of the disclosed technology will be apparent to those skilled in the art upon consideration of the specification and practice of the embodiments disclosed herein. The specification and examples given should be considered exemplary only, and it is contemplated that the appended claims will cover any other such embodiments or modifications.

The Abstract accompanying this specification is provided to enable the United States Patent and Trademark Office and the public generally to determine quickly from a cursory inspection the nature and gist of the technical disclosure and in no way intended for defining, determining, or limiting any of its embodiments in the disclosure.

FURTHER EXAMPLES HAVING A VARIETY OF FEATURES

Example 1: A half-bridge module, comprising: a monolithic die; a high-side transistor integrated in the monolithic die; a low-side transistor integrated in the monolithic die; and a decoupling capacitor integrated in the monolithic die, the decoupling capacitor disposed between the high-side transistor and the low-side transistor.

Example 2: The half-bridge module of Example 1, wherein each of the high-side transistor and the low-side transistor is a vertical power device such that a direction of main current of each of the high-side transistor and the low-side transistor is perpendicular to a top surface of the monolithic die.

Example 3: The half-bridge module of Example 1, wherein each of the high-side transistor and the low-side transistor is a Metal Oxide Semiconductor Field-Effect Transistor (MOSFET).

Example 4: The half-bridge module of Example 1, wherein a first terminal of the decoupling capacitor is connected to a drain terminal of the high-side transistor, and wherein a second terminal of the decoupling capacitor is connected to a source terminal of the low-side transistor.

Example 5: The half-bridge module of Example 4, wherein a capacitance value of the decoupling capacitor is determined based on a distance between the drain terminal of the high-side transistor and the source terminal of the low-side transistor.

Example 6: The half-bridge module of Example 1, wherein a source terminal of the high-side transistor is directly connected to a drain terminal of the low-side transistor.

Example 7: The half-bridge module of Example 1, wherein a drain terminal of the high-side transistor is connected to a positive voltage terminal, and wherein a source terminal of the low-side transistor is connected to a negative voltage terminal or a ground terminal.

Example 8: The half-bridge module of Example 1, wherein the decoupling capacitor comprises a plurality of capacitors connected in parallel to a drain terminal of the high-side transistor and a source terminal of the low-side transistor.

Example 9: The half-bridge module of Example 1, wherein a capacitance value of the decoupling capacitor is at least one order of magnitude higher than a capacitance value of the high-side transistor or the low-side transistor.

Example 10: The half-bridge module of Example 1, wherein each of the high-side transistor and the low-side transistor is a lateral power device such that a direction of main current of each of the high-side transistor and the low-side transistor is in parallel to a top surface of the monolithic die.

Example 11: The half-bridge module of Example 1, wherein a gate terminal of the low-side transistor is connected to a first gate-driver, wherein the first gate-driver is on the monolithic die, wherein a gate terminal of the high-side transistor is connected to a second gate-driver, and wherein the second gate-driver is on the monolithic die.

Example 12: The half-bridge module of Example 1, wherein a gate terminal of the low-side transistor is connected to a first gate-resistor, wherein the first gate-resistor is on the monolithic die, wherein a gate terminal of the high-side transistor is connected to a second gate-resistor, and wherein the second gate-resistor is on the monolithic die.

Example 13: The half-bridge module of Example 1, further comprising: a silicon carbide (SiC) substrate on the monolithic die.

Example 14: The half-bridge module of Example 1, wherein the high-side transistor is disposed in an opposite side to the low-side transistor such that main current flows in a U-shape.

Example 15: The half-bridge module of Example 14, wherein a source terminal of the low-side transistor is on a top surface of the monolithic die, wherein a drain terminal of the low-side transistor is on a bottom surface of the monolithic die, wherein a source terminal of the high-side transistor is on the bottom surface of the monolithic die, and wherein a drain terminal of the high-side transistor is on the top surface of the monolithic die.

Example 16: The half-bridge module of Example 1, wherein the high-side transistor and the low-side transistor are symmetrically disposed in the monolithic die such that main current flows in an N-shape.

Example 17: The half-bridge module of Example 16, wherein a source terminal of the low-side transistor is on a top surface of the monolithic die, wherein a drain terminal of the low-side transistor is connected from a bottom surface of the monolithic die to the top surface of the monolithic die, wherein a source terminal of the high-side transistor is connected from the top surface of the monolithic die to the bottom surface of the monolithic die, and wherein a drain terminal of the high-side transistor is on the bottom surface of the monolithic die.

Example 18: The half-bridge module of Example 1, wherein a source terminal of the low-side transistor and a source terminal of the high-side transistor share a common source terminal on a top surface of the monolithic die, and wherein a drain terminal of the low-side transistor and a drain terminal of the high-side transistor are on a bottom surface of the monolithic die.

Example 19: A half-bridge module, comprising: a monolithic die; a first switch integrated in the monolithic die; a second switch integrated in the monolithic die; and a decoupling capacitor integrated in the monolithic die, the decoupling capacitor disposed between the first switch and the second switch.

Example 20: The half-bridge module of Example 19, wherein the first switch comprises a high-side transistor, and wherein the second switch comprises a low-side transistor.

Example 21: The half-bridge module of Example 20, wherein each of the high-side transistor and the low-side transistor is a vertical power device such that a direction of main current of each of the high-side transistor and the low-side transistor is perpendicular to a top surface of the monolithic die.

Example 22: The half-bridge module of Example 21, wherein each of the high-side transistor and the low-side transistor is a Metal Oxide Semiconductor Field-Effect Transistor (MOSFET).

Example 23: The half-bridge module of Example 21, wherein a first terminal of the decoupling capacitor is connected to a drain terminal of the high-side transistor, and wherein a second terminal of the decoupling capacitor is connected to a source terminal of the low-side transistor.

Example 24: The half-bridge module of Example 23, wherein a capacitance value of the decoupling capacitor is determined based on a distance between the drain terminal of the high-side transistor and the source terminal of the low-side transistor.

Example 25: The half-bridge module of Example 21, wherein a source terminal of the high-side transistor is directly connected to a drain terminal of the low-side transistor.

Example 26: The half-bridge module of Example 21, wherein a drain terminal of the high-side transistor is connected to a positive voltage terminal, and wherein a source terminal of the low-side transistor is connected to a negative voltage terminal or a ground terminal.

Example 27: The half-bridge module of Example 21, wherein the decoupling capacitor comprises a plurality of capacitors connected in parallel to a drain terminal of the high-side transistor and a source terminal of the low-side transistor.

Example 28: The half-bridge module of Example 21, wherein a capacitance value of the decoupling capacitor is at least one order of magnitude higher than a capacitance value of the high-side transistor or the low-side transistor.

Example 29: The half-bridge module of Example 21, wherein each of the high-side transistor and the low-side transistor is a lateral power device such that a direction of main current of each of the high-side transistor and the low-side transistor is in parallel to a top surface of the monolithic die.

Example 30: The half-bridge module of Example 21, wherein a gate terminal of the low-side transistor is connected to a first gate-driver, wherein the first gate-driver is on the monolithic die, wherein a gate terminal of the high-side transistor is connected to a second gate-driver, and wherein the second gate-driver is on the monolithic die.

Example 31: The half-bridge module of Example 21, wherein a gate terminal of the low-side transistor is connected to a first gate-resistor, wherein the first gate-resistor is on the monolithic die, wherein a gate terminal of the high-side transistor is connected to a second gate-resistor, and wherein the second gate-resistor is on the monolithic die.

Example 32: The half-bridge module of Example 21, further comprising: a silicon carbide (SiC) substrate on the monolithic die.

Example 33: The half-bridge module of Example 21, wherein the high-side transistor is disposed in an opposite side to the low-side transistor such that main current flows in a U-shape.

Example 34: The half-bridge module of Example 33, wherein a source terminal of the low-side transistor is on a top surface of the monolithic die, wherein a drain terminal of the low-side transistor is on a bottom surface of the monolithic die, wherein a source terminal of the high-side transistor is on the bottom surface of the monolithic die, and wherein a drain terminal of the high-side transistor is on the top surface of the monolithic die.

Example 35: The half-bridge module of Example 21, wherein the high-side transistor and the low-side transistor are symmetrically disposed in the monolithic die such that main current flows a N-shape.

Example 36: The half-bridge module of Example 35, wherein a source terminal of the low-side transistor is on a top surface of the monolithic die, wherein a drain terminal of the low-side transistor is connected from a bottom surface of the monolithic die to the top surface of the monolithic die, wherein a source terminal of the high-side transistor is connected from the top surface of the monolithic die to the bottom surface of the monolithic die, and wherein a drain terminal of the high-side transistor is on the bottom surface of the monolithic die.

Example 37: The half-bridge module of Example 21, wherein a source terminal of the low-side transistor and a source terminal of the high-side transistor share a common source terminal on a top surface of the monolithic die, and wherein a drain terminal of the low-side transistor and a drain terminal of the high-side transistor are on a bottom surface of the monolithic die.

What is claimed is:

1. A half-bridge module, comprising:
    a monolithic die;
    a high-side transistor integrated in the monolithic die;
    a low-side transistor integrated in the monolithic die; and
    a decoupling capacitor integrated in the monolithic die, the decoupling capacitor disposed between the high-side transistor and the low-side transistor.

2. The half-bridge module of claim 1, wherein each of the high-side transistor and the low-side transistor is a vertical power device such that a direction of main current of each of the high-side transistor and the low-side transistor is perpendicular to a top surface of the monolithic die.

3. The half-bridge module of claim 1, wherein a first terminal of the decoupling capacitor is connected to a drain terminal of the high-side transistor, and
wherein a second terminal of the decoupling capacitor is connected to a source terminal of the low-side transistor.

4. The half-bridge module of claim 1, wherein a drain terminal of the high-side transistor is connected to a positive voltage terminal, and
wherein a source terminal of the low-side transistor is connected to a negative voltage terminal or a ground terminal.

5. The half-bridge module of claim 1, wherein the decoupling capacitor comprises a plurality of capacitors connected in parallel to a drain terminal of the high-side transistor and a source terminal of the low-side transistor.

6. The half-bridge module of claim 1, wherein each of the high-side transistor and the low-side transistor is a lateral power device such that a direction of main current of each of the high-side transistor and the low-side transistor is in parallel to a top surface of the monolithic die.

7. The half-bridge module of claim 1, wherein the high-side transistor is disposed in an opposite side to the low-side transistor such that main current flows in a U-shape.

8. The half-bridge module of claim 7, wherein a source terminal of the low-side transistor is on a top surface of the monolithic die,
wherein a drain terminal of the low-side transistor is on a bottom surface of the monolithic die,
wherein a source terminal of the high-side transistor is on the bottom surface of the monolithic die, and
wherein a drain terminal of the high-side transistor is on the top surface of the monolithic die.

9. The half-bridge module of claim 1, wherein the high-side transistor and the low-side transistor are symmetrically disposed in the monolithic die such that main current flows in an N-shape.

10. The half-bridge module of claim 9, wherein a source terminal of the low-side transistor is on a top surface of the monolithic die,
wherein a drain terminal of the low-side transistor is connected from a bottom surface of the monolithic die to the top surface of the monolithic die,
wherein a source terminal of the high-side transistor is connected from the top surface of the monolithic die to the bottom surface of the monolithic die, and
wherein a drain terminal of the high-side transistor is on the bottom surface of the monolithic die.

11. The half-bridge module of claim 1, wherein a source terminal of the low-side transistor and a source terminal of the high-side transistor share a common source terminal on a top surface of the monolithic die, and
wherein a drain terminal of the low-side transistor and a drain terminal of the high-side transistor are on a bottom surface of the monolithic die.

12. A half-bridge module, comprising:
a monolithic die;
a high-side transistor integrated in the monolithic die;
a low-side transistor integrated in the monolithic die; and
a decoupling capacitor integrated in the monolithic die, the decoupling capacitor disposed between the high-side transistor and the low-side transistor;
wherein a first terminal of the decoupling capacitor is connected to a drain terminal of the high-side transistor;
wherein a second terminal of the decoupling capacitor is connected to a source terminal of the low-side transistor; and
wherein a capacitance value of the decoupling capacitor is determined based on a distance between the drain terminal of the high-side transistor and the source terminal of the low-side transistor.

13. A half-bridge module, comprising:
a monolithic die;
a first switch integrated in the monolithic die;
a second switch integrated in the monolithic die; and
a decoupling capacitor integrated in the monolithic die, the decoupling capacitor disposed between the first switch and the second switch and having a capacitance value based on a distance between an output terminal of the first switch and an input terminal of the second switch.

14. The half-bridge module of claim 13, wherein the first switch comprises a high-side transistor, and
wherein the second switch comprises a low-side transistor.

15. The half-bridge module of claim 14, wherein each of the high-side transistor and the low-side transistor is a vertical power device such that a direction of main current of each of the high-side transistor and the low-side transistor is perpendicular to a top surface of the monolithic die.

16. The half-bridge module of claim 14, wherein the input terminal of the first switch comprises a drain terminal and the output terminal of the second switch comprises a source terminal, and further wherein a first terminal of the decoupling capacitor is connected to the drain terminal of the high-side transistor, and
wherein a second terminal of the decoupling capacitor is connected to the source terminal of the low-side transistor.

17. The half-bridge module of claim 14, wherein each of the high-side transistor and the low-side transistor is a lateral power device such that a direction of main current of each of the high-side transistor and the low-side transistor is in parallel to a top surface of the monolithic die.

18. A half-bridge module, comprising:
a monolithic die;
a high-side transistor integrated in the monolithic die;
a low-side transistor integrated in the monolithic die; and
a decoupling capacitor integrated in the monolithic die, the decoupling capacitor disposed between the high-side transistor and the low-side transistor;
wherein the first switch comprises a high-side transistor and the second switch comprises a low-side transistor; and
wherein the high-side transistor is disposed in an opposite side to the low-side transistor such that main current flows in a U-shape.

19. A half-bridge module, comprising:
a monolithic die;
a high-side transistor integrated in the monolithic die;
a low-side transistor integrated in the monolithic die; and
a decoupling capacitor integrated in the monolithic die, the decoupling capacitor disposed between the high-side transistor and the low-side transistor;
wherein the first switch comprises a high-side transistor and the second switch comprises a low-side transistor; and wherein the high-side transistor and the low-side transistor are symmetrically disposed in the monolithic die such that main current flows a N-shape.

20. A half-bridge module, comprising:
a monolithic die;
a high-side transistor integrated in the monolithic die;
a low-side transistor integrated in the monolithic die; and
a decoupling capacitor integrated in the monolithic die, the decoupling capacitor disposed between the high-side transistor and the low-side transistor;
wherein the first switch comprises a high-side transistor and the second switch comprises a low-side transistor; and
wherein a source terminal of the low-side transistor and a source terminal of the high-side transistor share a common source terminal on a top surface of the monolithic die, and
wherein a drain terminal of the low-side transistor and a drain terminal of the high-side transistor are on a bottom surface of the monolithic die.

* * * * *